(12) United States Patent
Kobayashi et al.

(10) Patent No.: US 10,287,685 B2
(45) Date of Patent: May 14, 2019

(54) SUSCEPTOR

(71) Applicant: BRIDGESTONE CORPORATION, Tokyo (JP)

(72) Inventors: Fumiya Kobayashi, Tokyo (JP); Sho Kumagai, Tokyo (JP); Kazuhiro Ushita, Tokyo (JP); Tadashi Onishi, Tokyo (JP); Tomonori Ishigaki, Tokyo (JP)

(73) Assignee: MARUWA CO., LTD., Owariasahi, Aichi (JP)

( * ) Notice: Subject to any disclaimer, the term of this patent is extended or adjusted under 35 U.S.C. 154(b) by 0 days.

(21) Appl. No.: 14/914,907

(22) PCT Filed: Aug. 29, 2014

(86) PCT No.: PCT/JP2014/072725
§ 371 (c)(1),
(2) Date: Feb. 26, 2016

(87) PCT Pub. No.: WO2015/030167
PCT Pub. Date: Mar. 5, 2015

(65) Prior Publication Data
US 2016/0281227 A1  Sep. 29, 2016

(30) Foreign Application Priority Data

Aug. 29, 2013 (JP) .................. 2013-177869
Aug. 26, 2014 (JP) .................. 2014-171502
Aug. 26, 2014 (JP) .................. 2014-171504

(51) Int. Cl.
H01L 21/67 (2006.01)
H01L 21/687 (2006.01)
C23C 16/458 (2006.01)

(52) U.S. Cl.
CPC ...... *C23C 16/4581* (2013.01); *C23C 16/4584* (2013.01); *H01L 21/67103* (2013.01);
(Continued)

(58) Field of Classification Search
CPC ............. H01L 21/687; H01L 21/68714; H01L 21/68757
See application file for complete search history.

(56) References Cited

U.S. PATENT DOCUMENTS 5,119,540 A * 6/1992 Kong .................. C30B 25/02
                                                    117/103
5,242,501 A * 9/1993 McDiarmid ............ C30B 25/12
                                                    118/728

(Continued)

FOREIGN PATENT DOCUMENTS

CN   1419661 A   5/2003
EP   1693884 A2  8/2006

(Continued)

OTHER PUBLICATIONS

Morgan Advanced Ceramics. CVD Materials. http://web.archive.org/web/20110430033909/http://performancematerial.com/applications.htm. Accessed Apr. 2, 2017.*

(Continued)

Primary Examiner — Tyrone V Hall, Jr.
(74) Attorney, Agent, or Firm — Shumaker, Loop & Kendrick, LLP

(57) ABSTRACT

Provided is a susceptor capable of achieving improved thermal uniformity while suppressing reduction in its temperature increase rate and heat utilization efficiency. A susceptor includes a plate-shaped first member including a wafer placement surface on which to place a wafer, and a second member supporting the first member and laid on the first member in the direction perpendicular to the wafer (Continued)

placement surface. The thermal conductivity of the first member is higher than the thermal conductivity of the second member.

7 Claims, 12 Drawing Sheets

(52) U.S. Cl.
CPC .. *H01L 21/68735* (2013.01); *H01L 21/68771* (2013.01); *H01L 21/68785* (2013.01)

(56) References Cited

U.S. PATENT DOCUMENTS

| | | | |
|---|---|---|---|
| 5,584,936 A * | 12/1996 | Pickering | C23C 16/4583 118/500 |
| 5,782,979 A * | 7/1998 | Kaneno | C23C 16/301 118/500 |
| 5,788,777 A * | 8/1998 | Burk, Jr. | C23C 16/4584 118/730 |
| 6,001,183 A * | 12/1999 | Gurary | C23C 16/4584 118/720 |
| 6,261,370 B1 | 7/2001 | Otsuki et al. | |
| 6,634,882 B2 * | 10/2003 | Goodman | C23C 16/4581 211/41.18 |
| 7,022,192 B2 * | 4/2006 | Dip | H01L 21/67309 118/725 |
| 8,691,665 B2 * | 4/2014 | Oka | H01L 21/302 257/E21.001 |
| 2001/0027970 A1 * | 10/2001 | Li | H01L 21/67115 219/390 |
| 2002/0106826 A1 | 8/2002 | Boguslayskiy et al. | |
| 2003/0047132 A1 | 3/2003 | Boguslayskiy et al. | |
| 2003/0111009 A1 | 6/2003 | Boguslayskiy et al. | |
| 2005/0167422 A1 * | 8/2005 | Kachi | H01L 21/67103 219/548 |
| 2006/0191639 A1 | 8/2006 | Tanaka et al. | |
| 2006/0269390 A1 * | 11/2006 | Nakamura | H01L 21/67103 118/500 |
| 2007/0142956 A1 * | 6/2007 | Escher | C23C 16/4404 700/121 |
| 2008/0029032 A1 * | 2/2008 | Sun | H01L 21/6833 118/728 |
| 2008/0035632 A1 * | 2/2008 | Fujita | C23C 16/4581 219/634 |
| 2012/0264051 A1 * | 10/2012 | Angelov | H01L 21/683 430/256 |
| 2013/0047924 A1 | 2/2013 | Enomoto et al. | |
| 2014/0042716 A1 | 2/2014 | Miura et al. | |
| 2016/0218024 A1 | 7/2016 | Kobayashi | |

FOREIGN PATENT DOCUMENTS

| | | | |
|---|---|---|---|
| JP | 60-200963 A | | 10/1985 |
| JP | 63-096912 A | | 4/1988 |
| JP | 3-199196 A | | 8/1991 |
| JP | 04-173977 A | | 6/1992 |
| JP | 05-291145 A | | 11/1993 |
| JP | 06-310438 A | | 11/1994 |
| JP | 07-022342 A | | 1/1995 |
| JP | 7-211606 A | | 8/1995 |
| JP | 08-22886 A | | 1/1996 |
| JP | 10-92913 A | | 4/1998 |
| JP | 2835861 B2 | | 12/1998 |
| JP | 2000-21788 A | | 1/2000 |
| JP | 2000-150524 A | | 5/2000 |
| JP | 2000-332096 A | | 11/2000 |
| JP | 2004-525056 A | | 8/2004 |
| JP | 2005-123582 A | | 5/2005 |
| JP | 2006-228883 A | | 8/2006 |
| JP | 2008-53340 A | | 3/2008 |
| JP | 2010129764 A | * | 6/2010 |
| JP | 2010-239020 A | | 10/2010 |
| JP | 2011-146504 A | | 7/2011 |
| JP | 2011-168426 A | | 9/2011 |
| JP | 2012-23183 A | | 2/2012 |
| JP | 2013-131614 A | | 7/2013 |
| JP | 2013-145859 A | | 7/2013 |
| JP | 2014-144880 A | | 8/2014 |
| TW | 201304049 A1 | | 1/2013 |
| TW | 201326453 A1 | | 7/2013 |

OTHER PUBLICATIONS

Accuratus. Aluminum Nitride, AlN Cermaic Properties. http://accuratus.com/alumni.html. Accessed Apr. 2, 2017.*
Morgan Advanced Cermaics. CVD Materials. http://web.archive.org/web/20110430033909/http://performancematerial.com/applications.htm. Accessed Apr. 2, 2017.*
Morgan Advanced Ceramics. CVD Materials. http://web.archive.org/web/20110430033909/http://performancematerial.com/applications.htm.*
Taiwanese Office Action of Application No. 103129888 dated Sep. 7, 2015.
International Search Report of PCT/JP2014/072725 dated Dec. 2, 2014.

* cited by examiner

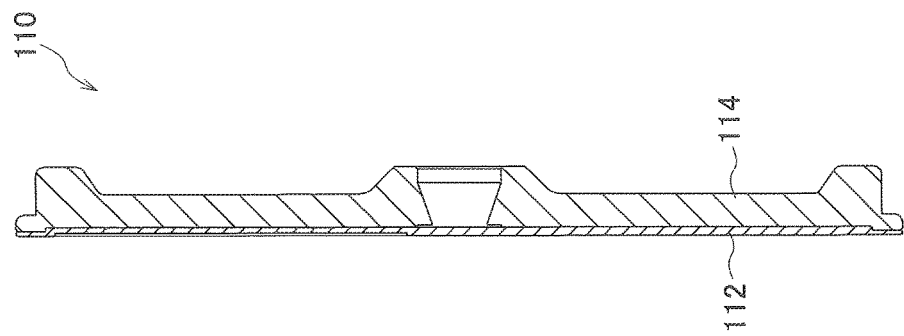
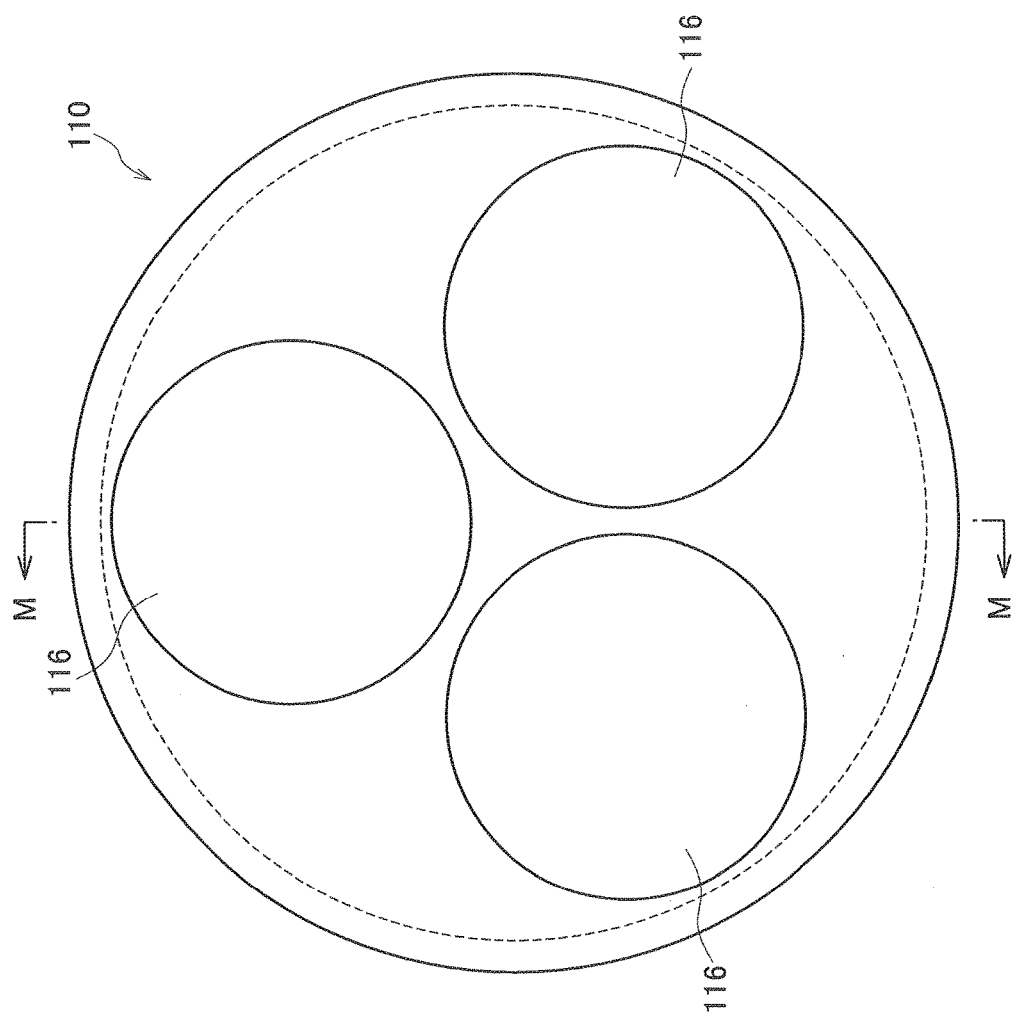
FIG. 9 (b)
FIG. 9 (a)

FIG. 16

| | DIAMETER OF SUSCEPTORS | ANGLE θ | LENGTH L (UNIT: mm) | RADIUS OF CURVATURE R (UNIT: mm) | STEP HEIGHT H (UNIT: mm) | ROBUSTNESS | THERMAL UNIFORMITY | WEIGHT |
|---|---|---|---|---|---|---|---|---|
| EXAMPLE 1 | 450φ | 45 | 5.2 | 5.0 | 6.5 | ○ | ○ | ○ |
| EXAMPLE 2 | 450φ | 15 | 5.2 | 5.0 | 6.5 | ○ | ○ | INCREASED |
| EXAMPLE 3 | 450φ | 80 | 5.2 | 5.0 | 6.5 | ○ | △ | REDUCED |
| EXAMPLE 4 | 450φ | 45 | 5.2 | 3.5 | 6.5 | ○ | ○ | ○ |
| EXAMPLE 5 | 450φ | 45 | 1.0 | 2.0 | 6.5 | ○ | ○ | REDUCED |
| EXAMPLE 6 | 450φ | 45 | 20.0 | 2.0 | 6.5 | ○ | △ | INCREASED |
| EXAMPLE 7 | 450φ | 45 | 2.2 | 0.1 | 6.5 | △ | ○ | ○ |
| COMPARATIVE EXAMPLE 1 | 450φ | 10 | 5.2 | 2.0 | 6.5 | ○ | △ | INCREASED |
| COMPARATIVE EXAMPLE 2 | 450φ | 85 | 5.2 | 2.0 | 6.5 | × | △ | REDUCED |

FIG. 17

| | DIAMETER OF SUSCEPTORS | ANGLE θ | LENGTH L (UNIT: mm) | RADIUS OF CURVATURE R (UNIT: mm) | STEP HEIGHT H (UNIT: mm) | ROBUSTNESS | THERMAL UNIFORMITY | WEIGHT |
|---|---|---|---|---|---|---|---|---|
| EXAMPLE 8 | 117 φ | 45 | 2.1 | 5.0 | 2.87 | ○ | ○ | ○ |
| EXAMPLE 9 | 117 φ | 15 | 2.1 | 5.0 | 2.87 | ○ | ○ | INCREASED |
| EXAMPLE 10 | 117 φ | 80 | 2.1 | 5.0 | 2.87 | ○ | △ | REDUCED |
| EXAMPLE 11 | 117 φ | 45 | 2.1 | 3.5 | 2.87 | ○ | ○ | ○ |
| EXAMPLE 12 | 117 φ | 45 | 1.0 | 2.0 | 2.87 | ○ | ○ | REDUCED |
| EXAMPLE 13 | 117 φ | 45 | 10.0 | 2.0 | 2.87 | ○ | △ | INCREASED |
| EXAMPLE 14 | 117 φ | 45 | 2.1 | 0.1 | 2.87 | △ | ○ | ○ |
| COMPARATIVE EXAMPLE 3 | 117 φ | 10 | 2.1 | 2.0 | 2.87 | ○ | △ | INCREASED |
| COMPARATIVE EXAMPLE 4 | 117 φ | 85 | 2.1 | 2.0 | 2.87 | × | △ | REDUCED |

SUSCEPTOR

CROSS REFERENCE TO RELATED APPLICATIONS

This application is a National Stage of International Application No. PCT/JP2014/072725 filed Aug. 29, 2014, claiming priority based on Japanese Patent Application Nos. 2013-177869filed on Aug. 29, 2013, 2014-171502 filed on Aug. 26, 2014, and 2014-171504 filed on Aug. 26, 2014, the contents of all of which are incorporated herein by reference in their entirety.

TECHNICAL FIELD

The present invention relates to a susceptor including a base member including a concave section and to a susceptor including a wafer pocket in which to place a wafer on its upper surface side.

BACKGROUND ART

A wafer holder configured to hold a wafer (hereinafter, "susceptor") has heretofore been used during a process of generating a film of GaN or the like on the surface of the wafer. A susceptor is required to have characteristics such as high thermal resistance, high durability, and high strength. For this reason, for such susceptors, silicon carbide members made of high-purity silicon carbide or carbon-material base members coated with an SiC film or the like have been used (e.g. Patent Literatures 1 and 2).

Also, various members such as jigs (wafer boat, susceptor, holder) for semiconductor apparatuses for semiconductor heat treatment furnaces to be used to manufacture semiconductor elements and devices are required to have characteristics such as high thermal resistance, high durability, and high strength. For this reason, silicon-carbide base members using high-purity silicon carbide (SiC) or carbon base members coated with an SiC film or the like have been widely used. Conventional susceptors are often susceptors with enhanced corrosion resistance obtained by performing CVD-SiC coating (SiC coating by chemical vapor deposition) on a graphite base member.

CITATION LIST

Patent Literatures

Patent Literature 1: Japanese Patent Application Publication No. 2000-332096
Patent Literature 2: Japanese Patent Application Publication No. 2010-239020

SUMMARY OF INVENTION

Technical Problem

Meanwhile, in recent years, with the increase in wafer diameter and other similar trends, the sizes of the wafer placement surfaces of susceptors have also increased, and the susceptors are required to have high thermal uniformity. On the other hand, in view of the temperature increase rate and the heat utilization efficiency of susceptors, it is preferable to make susceptors with members with high thermal conductivity, and it is preferable to use susceptors made of high-purity silicon carbide.

However, using a susceptor made of high-purity silicon carbide entails a possibility due to its high thermal conductivity that a heaters pattern may be directly transferred to the wafer and, ironically, uneven heating may occur.

The present invention has thus been made to solve this first problem, and an object thereof is to provide a susceptor capable of achieving improved thermal uniformity while suppressing reduction in its temperature increase rate and heat utilization efficiency.

Also, after use of a susceptor for a certain period of time (several months), its CVD-SiC film starts to come off, thus resulting in generation of impurities from the graphite in its base member. For this reason, replacement is required within a short period of time. This short life of a susceptor increases the replacement cost.

Also, with the increase in wafer diameter and other similar trends, the sizes of the wafer placement surfaces of susceptors have also increased, and the susceptors are required to have even higher thermal uniformity.

For this reason, there has been an increasing demand for susceptors entirely made of high-purity SiC. However, manufacturing such a susceptor takes times due to the poor workability of SiC, and SiC is an expensive material as well. Thus, the cost of the susceptor is high.

The present invention has thus been made to solve this second problem, and an object thereof is to provide a susceptor capable of achieving a longer life than conventional ones even if the susceptor is not entirely made of high-purity SiC.

Also, in recent years, with the increase in wafer diameter and other similar trends, the sizes of the wafer placement surfaces of susceptors have also increased, and the susceptors are required to have even higher thermal uniformity. Thus, in view of the temperature increase rate and the heat utilization efficiency of susceptors, it is preferable to make susceptors with members with high thermal conductivity, and it is preferable to use susceptors made of silicon carbide (SiC). However, since silicon carbide has a large specific gravity, such susceptors are desired to be made lighter in weight.

A possible way to reduce the weight of a susceptor is to form the back surface side of the susceptor into a recessed shape.

Here, around the center of a spindle that rotates a susceptor, a certain thickness needs to be maintained to prevent adverse effects such as deterioration in thermal uniformity due to the withdrawal of heat-through the spindle. Hence, the susceptor needs to have a large thickness on its back surface side around the center of the spindle.

However, on the back surface side of such a susceptor, a step is formed between the thick portion around the center of the spindle and a thin portion which is formed as a result of forming the back surface side of the susceptor into the recessed shape. This step deteriorates the thermal uniformity, and breakage may possibly occur due to thermal stress concentration during heating and the weight of the susceptor itself.

The present invention has thus been made to solve this third problem, and an object thereof is to provide a susceptor with a structure that prevents breakage even if the susceptor is made of silicon carbide and made lighter in weight.

Solution to Problems

A susceptor according to a first feature includes: a plate-shaped first member including a wafer placement surface on which to place a wafer; and a second member supporting the first member and laid on the first member in a direction perpendicular to the wafer placement surface. Thermal conductivity of the first member is higher than thermal conductivity of the second member.

In the first feature, the first member is configured to be detachably attachable to the second member.

In the first feature, the first member is made of silicon carbide having a purity of 6N or higher.

In the first feature, the second member is made of silicon carbide having a purity of 2N to 3N.

In the first feature, the second member is made of graphite.

In the first feature, the thermal conductivity of the second member is in a range of 140 to 170 W/(m·K).

In the first feature, thickness of the second member is in a range of 5 to 15 mm.

In the first feature, thermal resistance of the second member is in a range of $5.8 \times 10^{-3}$ to $7.1 \times 10^{-3}$ m·K/W.

In the first feature, the second member has any one of a plate shape and an annular shape.

A susceptor according to a second feature is a susceptor including a wafer pocket in which to place a wafer, and includes: an upper member including the wafer pocket on an upper surface side thereof, including a convex fitting section on a lower surface side thereof, and made of silicon carbide, the convex fitting section protruding downward from a position radially inward of an outer peripheral section of the upper member; and a lower member including a concave fitting section on an upper surface side thereof, supporting the upper member therewith, and made of silicon carbide, the concave fitting section being configured to come into surface contact with a lower surface of the convex fitting section. When the upper member is set on the lower member as the convex fitting section is inserted into the concave fitting section, the lower member is entirely covered by the upper member in a plan view and the outer peripheral section is not in contact with the lower member.

A susceptor according to a third feature is a susceptor including a wafer pocket in which to place a wafer, and includes: an upper member including the wafer pocket on an upper surface side thereof, including a concave fitting section on a lower surface side thereof, and made of silicon carbide, the concave fitting section being recessed upward from a position radially inward of an outer peripheral section of the upper-member; and a lower member including a convex fitting section on an upper surface side thereof, supporting the upper member therewith, and made of silicon carbide, the convex fitting section being configured to come into surface contact with a bottom surface of the concave fitting section. When the upper member is set on the lower member as the convex fitting section is inserted into the concave fitting section, the lower member is entirely covered by the upper member in a plan view and the outer peripheral section is not in contact with the lower member.

A susceptor according to a fourth feature includes: a plate-shaped upper member including a wafer placement surface on which to place a wafer and made of silicon carbide; and a lower member on which the upper member is laid and which supports the upper member, includes a downwardly-protruding bearing section at a rotational center position, and is made of silicon carbide. The lower member includes a bearing lower surface forming a lower surface side of the bearing section, and an expanding surface expanding gently in an obliquely upward direction from an outer periphery of the bearing lower surface and continuing to a lower surface of a lower member body around the bearing section. An angle between an imaginary extension plane extending from the bearing lower surface and the expanding surface is in a range of 15 to 80°, and the expanding surface includes a curved surface connected to the lower surface of the lower member body and having a radius of curvature in a range of 0.1 to 1.0 mm.

Advantageous Effects of Invention

According to the first feature of the present invention, it is possible to provide a susceptor capable of achieving improved thermal uniformity while suppressing reduction in its temperature increase rate and heat utilization efficiency.

Also, according to the second and third features of the present invention, it is possible to provide a susceptor capable of achieving a longer life than conventional ones even if the susceptor is not entirely made of high-purity SiC.

Also, according to the fourth feature of the present invention, it is possible to provide a susceptor with a structure that prevents breakage even if the susceptor is made of silicon carbide and made lighter in weight.

BRIEF DESCRIPTION OF DRAWINGS

FIG. 9(a) is a plan view showing a susceptor according to a second embodiment, and FIG. 9(b) is a side cross-sectional view taken along a line M-M in FIG. 9(a).

FIG. 16 is an explanatory chart showing conditions for susceptors and their evaluation results in Test Example 1.

FIG. 17 is an explanatory chart showing conditions for susceptors and their evaluation results in Test Example 2.

DESCRIPTION OF EMBODIMENTS

Susceptors according to embodiments of the present invention will be described below with reference to drawings. Note that in the following illustration of the drawings, identical or similar portions are denoted by identical or similar reference signs.

[Overview of First Embodiment]

First, a first embodiment will be described. It should be also noted that the drawings in this embodiment are merely schematic and that dimensional ratios and the like may be different from the actual ones. Thus, specific dimensions and the like should be determined in consideration of the following description. In addition, some drawings may include sections and portions which differ from one drawing to another in terms of dimensional relationship and ratio, as a matter of course.

A susceptor according to this embodiment includes a plate-shaped first member including a wafer placement surface on which to place wafers, and a second member supporting the first member and laid on the first member in the direction perpendicular to the wafer placement surface. The thermal conductivity of the first member is higher than the thermal conductivity of the second member.

In this embodiment, the thermal conductivity of the plate-shaped first member, which includes the wafer placement surface, is higher than the thermal conductivity of the second member. In this way, reduction in temperature increase rate and heat utilization efficiency of the susceptor is suppressed. On the other hand, the thermal conductivity of the second member, which is arranged on a heater side relative to the first member, is lower than the thermal conductivity of the first member. In this way, direct transfer of the heater's pattern to the wafers is suppressed and thus the thermal uniformity in the wafer placement surface is improved.

[First Embodiment]

(Structure of Susceptor)

Figure 1:
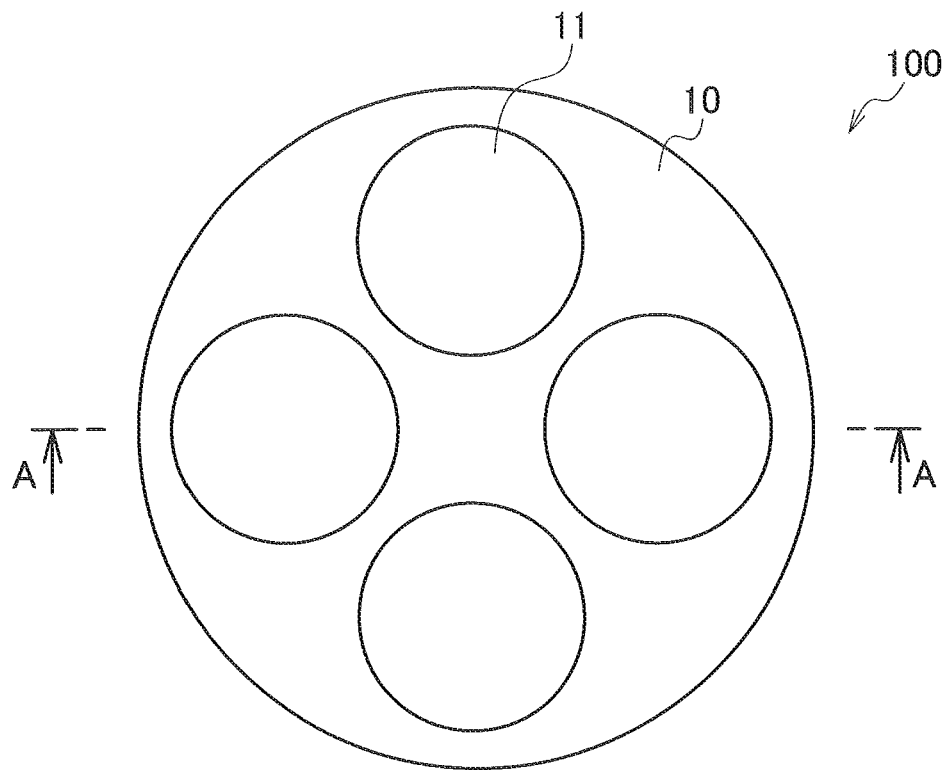
FIG. 1 is a view showing a susceptor according to a first embodiment.
Figure 2:
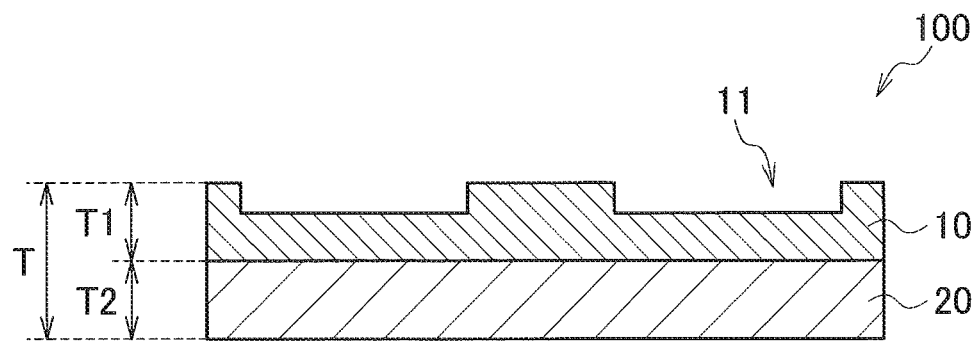
FIG. 2 is a cross-sectional view of the susceptor according to the first embodiment.

The susceptor according to the first embodiment will be described below with reference to drawings. FIG. 1 and FIG. 2 are views showing a susceptor 100 according to the first embodiment. FIG. 1 is a view showing the main surface (wafer placement surface) of the susceptor 100. FIG. 2 is a view schematically showing a cross section of the susceptor 100 (a cross section taken along a line A-A shown in FIG. 1).

As shown FIG. 1 and FIG. 2, the susceptor 100 includes a first member 10 and a second member 20.

The first member 10 includes a wafer placement surface on which to set wafers. The first member 10 includes concave sections 11 and supports the wafers in the concave sections 11.

The first member 10 has a plate shape. The first member 10 has a circular shape on a projection plane parallel to the wafer placement surface. The first member 10 is made for example of silicon carbide having a purity of 6N or higher. Specifically, the first member 10 is obtained by processing a mixture containing silicon carbide with a hot press in a temperature condition of 2000 to 2400° C. and a pressure condition of 300 to 700 kg/cm². With the purity of the silicon carbide constituting the first member 10 being 6N or higher, reduction in temperature increase rate and heat utilization efficiency of the susceptor 100 is suppressed. Here, N represents purity. 3N means a purity of 99.9%, and 6N means a purity of 99.9999%. "Purity" means the purity of the main metallic material and is a value obtained by subtracting the amount of metallic impurities from 100 and expressed as "100%−metallic impurities (%)=purity (%)."

The second member 20 supports the first member 10 and is laid on the first member 10 in the direction perpendicular to the wafer placement surface. In other words, the second member 20 is arranged on a heating source (heater) side relative to the first member 10.

The second member 20 has a plate shape. The second member 20 has a circular shape on a projection plane parallel to the wafer placement surface. The second member 20 is made for example of silicon carbide having a purity of 99 to 99.9%. Specifically, the second member 20 is obtained by sintering a mixture containing silicon carbide with use of a sintering aid such as yttria ($Y_2O_3$) in a temperature condition of 2000 to 2200° C. In the case where the second member 20 is made of silicon carbide as above, the purity of the silicon carbide constituting the second member 20 is lower than the purity of the silicon carbide constituting the first member 10 and in the range of 2N to 3N. With the purity of the silicon carbide constituting the second member 20 being 3N or lower, direct transfer of the heater's pattern to the wafers is suppressed. On the other hand, with the purity of the silicon carbide constituting the second member 20 being 2N or higher, reduction in temperature increase rate and heat utilization efficiency of the susceptor 100 is suppressed.

In the first embodiment, the thermal conductivity of the first member 10 is higher than the thermal conductivity of the second member 20. The thermal conductivity of the first member 10 is 200 W/(m·K) or higher (the condition of measurement of physical properties such as thermal conductivity and thermal resistance will hereinafter be assumed as a room temperature condition), and the thermal conductivity of the second member 20 is in the range of 140 to 170 W/(m·K). The thermal conductivity of the first member 10 is 200 W/(m·K) or higher for a similar reason to the reason why the purity of the silicon carbide constituting the first member 10 is 6N or higher. The thermal conductivity of the second member 20 is in the range of 140 to 170 W/(m·K)for a similar reason to the reason why the purity of the silicon carbide constituting the second member 20 is in the range of 2N to 3N.

In the first embodiment, assuming that thickness T of the susceptor 100 is constant in the direction perpendicular to the wafer placement surface, thickness T1 of the first member 10 and thickness T2 of the second member 20 are preferably as follows. Specifically, the thickness T1 of the first member 10 is preferably 1 mm or larger. With the thickness T1 being 1 mm or larger, reduction in temperature increase rate and heat utilization efficiency of the susceptor 100 is suppressed. On the other hand, the thickness T2 of the second member 20 is preferably 5 to 15 mm. With the thickness T2 being 5 mm or larger, direct transfer of the heater's pattern to the wafers is suppressed. On the other hand, with the thickness T2 being 15 mm or smaller, the thermal conductivity of the susceptor 100 as a whole increases, thereby suppressing reduction in temperature increase rate and heat utilization efficiency of the susceptor 100.

In this embodiment, the thermal resistance of the first member 10 is lower than the thermal resistance of the second member 20. The thermal resistance of the first member 10 is $5.0 \times 10^{-3}$ m·K/W or lower, and the thermal resistance of the second member 20 is in the range of $5.8 \times 10^{-3}$ to $7.1 \times 10^{-3}$ m·K/W. With the thermal resistance of the first member 10 being $5.0 \times 10^{-3}$ m·K/W or lower, reduction in temperature increase rate and heat utilization efficiency of the susceptor 100 is suppressed. With the thermal resistance of the second member 20 being $5.8 \times 10^{-3}$ m·K/W or higher, direct transfer of the heater's pattern to the wafers is suppressed. On the other hand, with the thermal resistance of the second member 20 being $7.1 \times 10^{-3}$ m·K/W or lower, reduction in temperature increase rate and heat utilization efficiency of the susceptor 100 is suppressed.

(Advantageous Effects)

In the first embodiment, the thermal conductivity of the plate-shaped first member 10, which includes the wafer placement surface, is higher than the thermal conductivity of the second member 20. In this way, reduction in temperature increase rate and heat utilization efficiency of the susceptor 100 is suppressed. On the other hand, the thermal conductivity of the second member 20, which is arranged on the heater side relative to the first member 10, is lower than the thermal conductivity of the first member 10. In this way, direct transfer of the heater's pattern to the wafers is suppressed and thus the thermal uniformity in the wafer placement surface is improved.

Also, the arranging of the second member 20 on the heater side relative to the first member 10 makes it difficult for the heat in the susceptor 100 to escape therefrom through a support supporting the susceptor 100.

[Modification 1]

Modification 1 of the first embodiment will be described below. The following description will be given mainly of the difference from the first embodiment.

In the first embodiment, the second member 20 is made of silicon carbide having purity lower than the purity of the silicon carbide constituting the first member 10. However, the second member 20 may be made of graphite. In the case where the second member 20 is made of graphite, too, the thermal conductivity, the thickness T2, and the thermal resistance of the second member 20 are preferably in the ranges mentioned above.

[Modifications 2 to 5]

Modifications 2 to 5 of the first embodiment will be described below. The following description will be given mainly of the differences from the first embodiment.

The manner in which the first member 10 and the second member 20 are laid on each other is not discussed in the first embodiment. The manners described below are possible manners of laying the first member 10 and the second member 20 on each other.

Figure 3:
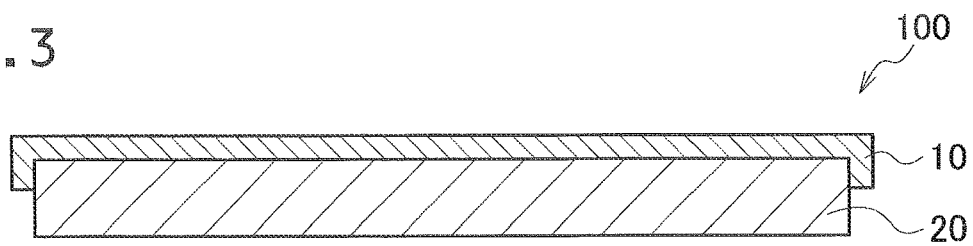
FIG. 3 is a cross-sectional view of a susceptor according to Modification 2.

For example, as shown in FIG. 3 as Modification 2, the first member 10 may include a wall continuously extending along the outer periphery of the first member 10 and protruding downward (toward the heater). The wall of the first member 10 is provided in such a way as to cover at least part of the side surface of the second member 20. In this way, by simply placing the first member 10 on the second member 20, displacement of the first member 10 and the second member 20 from each other by the rotation of the susceptor 100 is suppressed.

Figure 4:
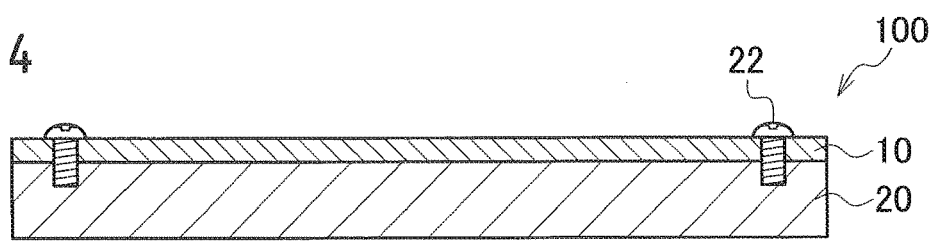
FIG. 4 is a cross-sectional view of a susceptor according to Modification 3.

Alternatively, as shown in FIG. 4 as Modification 3, the first member 10 may be fixed to the second member 20 with screws 22. In this way, displacement of the first member 10 and the second member 20 from each other by the rotation of the susceptor 100 is suppressed.

Figure 5:
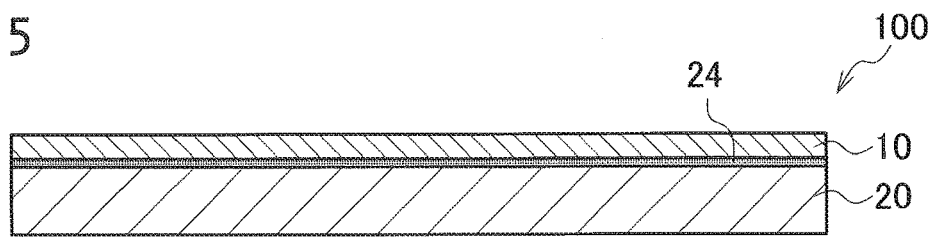
FIG. 5 is a cross-sectional view of a susceptor according to Modification 4.

Alternatively, as shown in FIG. 5 as Modification 4, the first member 10 may be fixed to the second member 20 with an adhesive layer 24 interposed therebetween. In this way, displacement of the first member 10 and the second member 20 from each other by the rotation of the susceptor 100 is suppressed.

Figure 6:
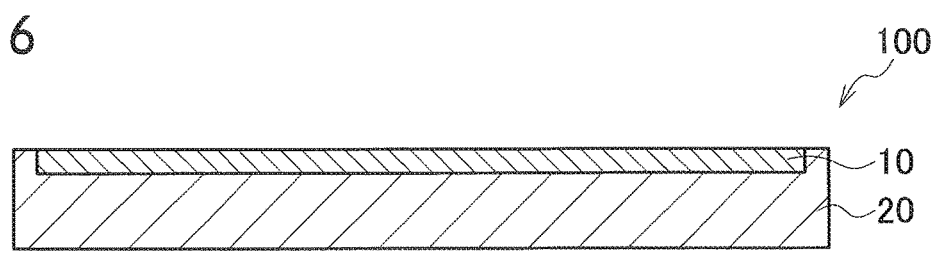
FIG. 6 is a cross-sectional view of a susceptor according to Modification 5.

Alternatively, as shown in FIG. 6 as Modification 5, the second member 20 may include a wall continuously extending along the outer periphery of the second member 20 and protruding upward (toward the wafer placement surface). The wall of the second member 20 is provided, in such a way as to cover at least part of the side surface of the first member 10. In this way, by simply placing the first member 10 on the second member 20, displacement of the first member 10 and the second member 20 from each other by the rotation of the susceptor 100 is suppressed.

The first member 10 is preferably configured to be detachably attachable to the second member 20, as described above. If the first member 10 is detachably attachable to the second member 20, the first member 10, which wears more intensely than the second member 20, can be replaced, and the second member 20 can be reused.

[Modification 6]

Modification 6 of the first embodiment will be described below. The following description will be given mainly of the difference from the first embodiment.

In the first embodiment, the second member 20 has a plate shape. In contrast, in Modification 6, the second member 20 has an annular shape on a projection plane parallel to the wafer placement surface.

Figure 7:
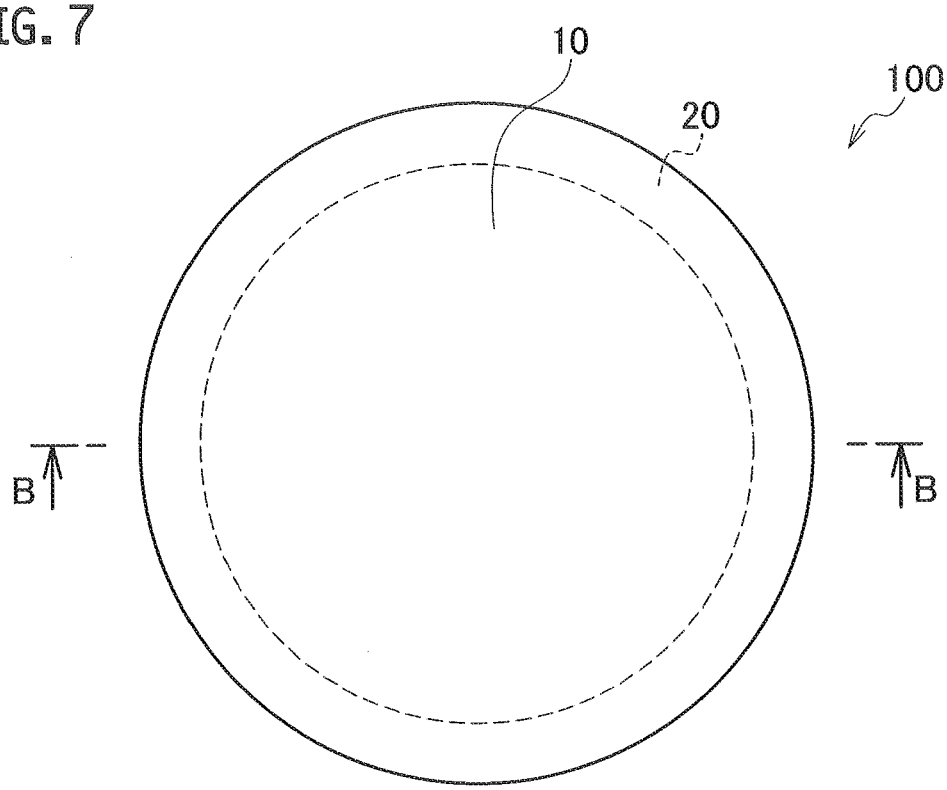
FIG. 7 is a view showing a susceptor according to Modification 6.
Figure 8:
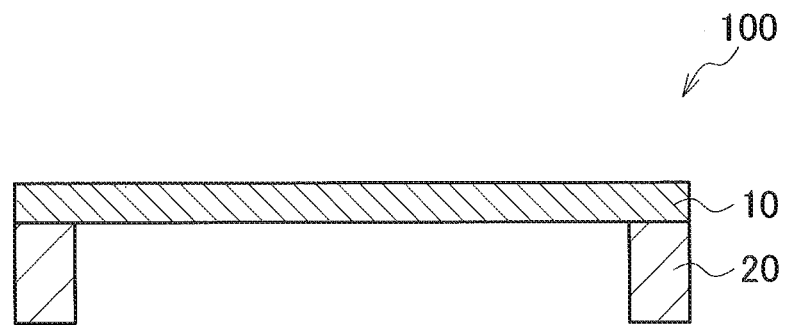
FIG. 8 is a cross-sectional view of the susceptor according to Modification 6.

Specifically, as shown in FIG. 7 and FIG. 8, the second member 20 has such a shape as to continuously extend along the outer periphery of the first member 10 and project downward (toward the heater). Note that FIG. 7 is a view showing the main surface (wafer placement surface) of the susceptor 100, and FIG. 8 is a view schematically showing a cross section of the susceptor 100 (a cross section taken along a line B-B shown in FIG. 7).

In the case of the susceptor 100 shown in Modification 6, the second member 20 forms a space between the first member 10 and the heater. This also suppresses direct transfer of the heater's pattern to the wafers and thereby improves the thermal uniformity in the wafer placement surface, as in the first embodiment.

[Second Embodiment]

Figure 10:
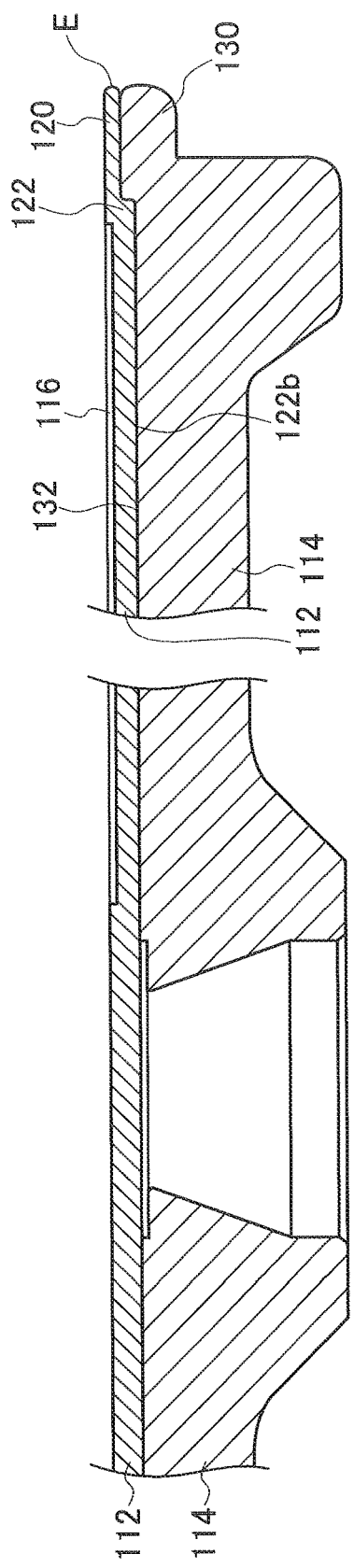
FIG. 10 is a partially enlarged view of FIG. 9(b).
Figure 11:
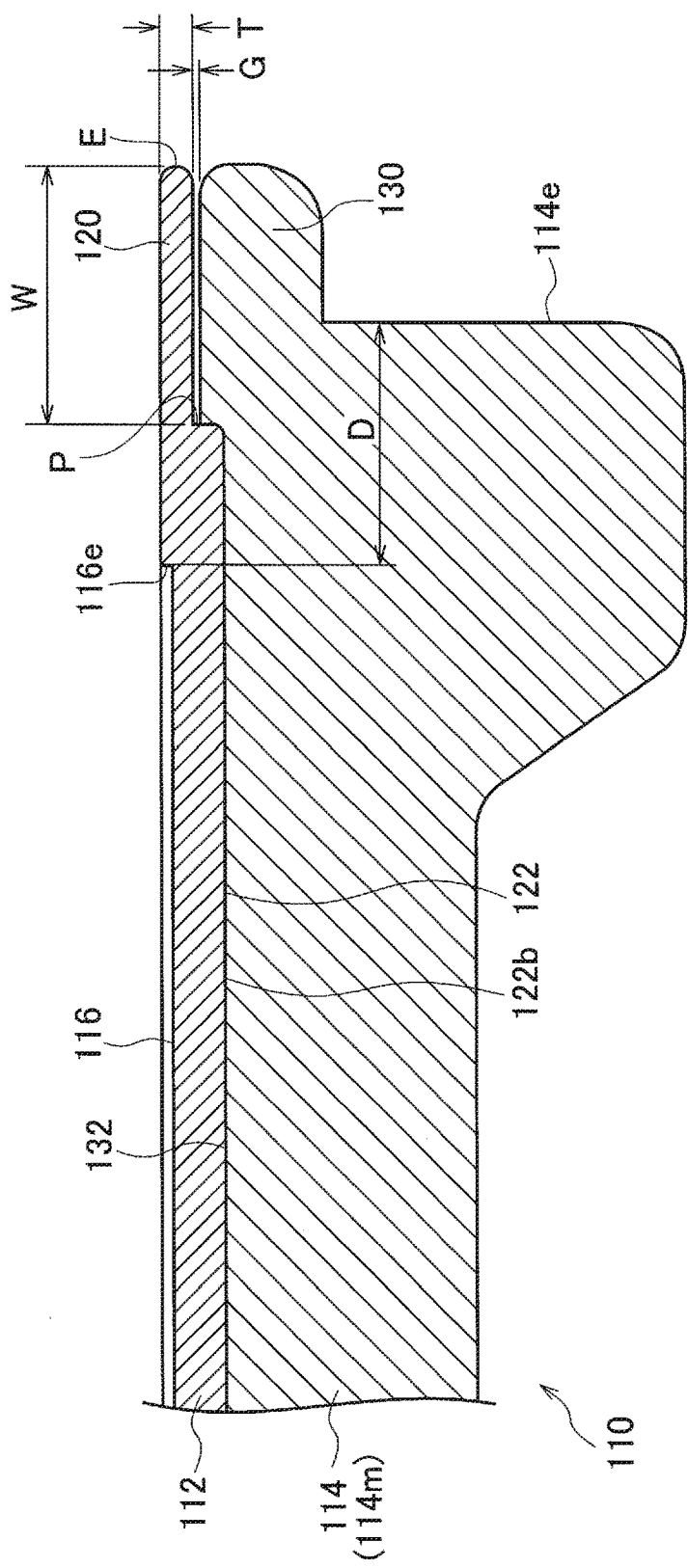
FIG. 11 is a partially enlarged view of FIG. 10.

Next, a second embodiment will be described. FIG. 9(a) is a plan view showing a susceptor 110 according to this embodiment. FIG. 9(b) is a side cross-sectional view taken along a line M-M in FIG. 9(a). FIG. 10 is a partially enlarged view of FIG. 9(b). FIG. 11 is a partially enlarged view of FIG. 10.

As shown in FIG. 9(a), FIG. 9(b), FIG. 10, and FIG. 11, the susceptor 110 in this embodiment includes an upper member 112 and a lower member 114. The upper member 112 and the lower member 114 each have a circular plate shape when seen from a projection plane parallel to a wafer placement surface (i.e. in a plan view). The upper member 112 is made of high-purity silicon carbide. The lower member 114 is made of silicon carbide with purity lower than the purity of the upper member 112.

The upper member 112 includes wafer pockets 116 in which to place wafers on its upper surface side. Also, in this embodiment, an upper flange section 120 is fog as an outer peripheral section of the upper member 112. Moreover, the upper member 112 includes a convex fitting section 122 on its lower surface side, the convex fitting section 122 protruding downward from a position radially inward of the upper flange section 120. The lower member 114 includes a concave fitting section 132 on its upper surface side and is configured to support the upper member 112 therewith, the concave fitting section 132 being configured to come into surface contact with a lower surface 122b of the convex fitting section 122.

When the upper member 112 is set on the lower member 114 as the convex fitting section 122 is inserted into the concave fitting section 132, the lower member 114 is entirely covered by the upper member 112 in a plan view and the outer peripheral section of the upper member 112 is not in contact with the lower member 114.

Also, the lower member 114 includes a lower outer peripheral section 130 (lower flange section) formed to face the upper flange section 120 when the upper member 112 is set on the lower member 114. Thus, a gap G is formed between the upper flange section 120 and the lower outer peripheral section 130 when the upper member 112 is set on the lower member 114.

Also, in this embodiment, the positions where the wafer pockets 116 are formed are determined in advance such that the horizontal positions of the wafer pockets 116 are entirely situated radially inward of an inner peripheral end P of the space forming the gap G when the upper member 112 is set on the lower member 114.

Also, in this embodiment, the lower outer peripheral section 130 protrudes radially outward from a lower member body 114m which constitutes the lower member 114. Further, the horizontal position of an outer-periphery-side end 116e of each wafer pocket 116 is situated radially inward of an outer peripheral wall 114e of the lower member body 114m.

Also, the upper member 112 is made of high-purity silicon carbide, e.g. silicon carbide having a purity of 6N or higher. Here, "purity" means the purity of the main metallic material and is a value obtained by subtracting the amount of metallic impurities from 100 and expressed as "100%−the proportion of metallic impurities (%)=purity (%)." Moreover, the unit N, Which represents the purity, means the number of a series of 9s indicating the proportion of the main metallic material in percentage by weight. For example, 3N means a purity of 99.9%, and 6N means a purity of 99.9999%.

In a specific, detailed example, the upper member 112 is obtained by processing a mixture containing silicon carbide with a hot press in a temperature condition of 2000 to 2400° C. and a pressure condition of 300 to 700 kg/cm$^2$. With the purity of the silicon carbide in the upper member 112 being 6N or higher, reduction in temperature increase rate and heat utilization efficiency of the susceptor 110 is suppressed.

The lower member 114 supports the upper member 112 and is laid on the upper member 112 in the direction perpendicular to the wafer placement surface. Specifically, the lower member 114 is arranged on a heating source (heater) side relative to the upper member 112.

Also, the lower member 114 is made for example of silicon carbide having a purity of 99 to 99.9%. In a specific, detailed example, the lower member 114 is obtained by sintering a mixture containing silicon carbide with use of a sintering aid such as yttria ($Y_2O_3$) in a temperature condition of 2000 to 2200° C. In the case where the lower member 114 is made of silicon carbide as above, the purity of the silicon carbide constituting the lower member 114 is lower than the purity of the silicon carbide constituting the upper member 112 and is preferably in the range of 2N to 3N. With the purity of the silicon carbide constituting the lower member 114 being 3N or lower, direct transfer of the heater's pattern to the wafers is suppressed. On the other hand, with the purity of the silicon carbide constituting the lower member 114 being 2N or higher, reduction in temperature increase rate and heat utilization efficiency of the susceptor 110 is suppressed.

In this embodiment, the thermal conductivity of the upper member 112 is higher than the thermal conductivity of the lower member 114. For example, the thermal conductivity of the upper member 112 is 200 W/(m·K) or higher, and the thermal conductivity of the lower member 114 is in the range of 140 to 170 W/(m·K) In this case, the thermal conductivity of the upper member 112 is 200 W/(m·K) or higher for a similar reason to the reason why the purity of the silicon carbide constituting the upper member 112 is 6N or higher. The thermal conductivity of the lower member 114 is in the range of 140 to 170 W/(m·K) for a similar reason to the reason why the purity of the silicon carbide constituting the lower member 114 is in the range of 2N to 3N.

Also, the thermal resistance of the upper member 112 is lower than the thermal resistance of the lower member 114. The thermal resistance of the upper member 112 is $5.0 \times 10^{-3}$ m·K/W or lower, and the thermal resistance of the lower member 114 is in the range of $5.8 \times 10^{-3}$ to $7.1 \times 10^{-3}$ m·K/W. With the thermal resistance of the upper member 112 being $5.0 \times 10^{-3}$ m·K/W or lower, reduction in temperature increase rate and heat utilization efficiency of the susceptor 110 is suppressed. With the thermal resistance of the lower member 114 being $5.8 \times 10^{-3}$ m·K/W or higher, direct transfer of the heater's pattern to the wafers is suppressed. On the other hand, with the thermal resistance of the lower member 114 being $7.1 \times 10^{-3}$ m·K/W or lower, reduction in temperature increase rate and heat utilization efficiency of the susceptor 110 is suppressed.

(Advantageous Effects)

The advantageous effects of this embodiment will be described below.

In this embodiment, when the upper member 112 is set on the lower member 114 as the convex fitting section 122 is inserted into the concave fitting section 132, the lower member 114 is entirely covered by the upper member 112 in a plan view. In this way, the heat in the lower member 114 is prevented from escaping upward from the lower outer peripheral section 130 and causing a local temperature drop.

Moreover, when the upper member 112 is set on the lower member 114 as the convex fitting section 122 is inserted into the concave fitting section 132, the upper flange section 120, which is the outer peripheral section of the upper member 112, is not in contact with the lower outer peripheral section 130, which is the outer peripheral section of the lower member 114. In this way, the lower outer peripheral section 130 never blocks the downward movement of the upper flange section 120, thereby ensuring surface contact of the bottom surface of the convex fitting section 122 with a bottom surface 132s of the concave fitting section 132. Hence, the temperature of the upper member 112 can be uniform, and the temperatures of the wafers placed in the wafer pockets 116 can be uniform accordingly. As a result, the yield is improved. This advantageous effect is particularly significant during an operation period when the wafers are inserted in the wafer pockets 116 since the space in which the susceptor 110 is accommodated is in a vacuum state.

Meanwhile, since the upper flange section 120 is not in contact with the lower outer peripheral section 130, the temperature of the upper flange section 120 is likely to be different from the temperature of the convex fitting section 122, which is in surface contact with the concave fitting section 132. Nonetheless, in this embodiment, all of the wafer pockets 116 are formed in the upper member 112 at positions radially inward of the upper flange section 120. Hence, the temperatures at the wafer pockets 116 can be further uniform, and it is therefore easy to further uniformly maintain the temperatures of the placed wafers.

Also, the thermal conductivity of the plate-shaped upper member 112, which includes the wafer placement surface, is higher than the thermal conductivity of the lower member 114. In this way, reduction in temperature increase rate and heat utilization efficiency of the susceptor 110 is suppressed. On the other hand, the thermal conductivity of the lower member 114, which is arranged on the heater side relative to the upper member 112, is lower than the thermal conductivity of the upper member 112. In this way, direct transfer of the heater's pattern to the wafers is suppressed and thus the thermal uniformity in the wafer placement surface is improved.

Also, the arranging of the lower member 114 on the heater side relative to the upper member 112 makes it difficult for the heat in the susceptor 110 to escape therefrom through a support supporting the susceptor 110.

Note that in this embodiment, the gap G, which is formed between the upper flange section 120 and the lower outer peripheral section 130 when the upper member 112 is set on the lower member 114, is preferably 0.1 mm or smaller. In this way, it is easy to sufficiently prevent the upper member 112 from being detached from the lower member 114 and thrown out while the susceptor 110 is in use. Moreover, the upper flange section 120 is reinforced by the lower outer peripheral section 130 as well. Meanwhile, the gap G is preferably 1 μm or larger in view of ensuring release of gas.

Also, the gap G is preferably formed to extend a distance W of 1 mm or longer radially inward from an outer periphery E of the upper member 112, i.e. an outer periphery E of the upper flange section 120. In this way, it is easy to ensure release of gas between the convex fitting section 122 and the concave fitting section 132. Meanwhile, W is preferably 50 mm or smaller in view of the thermal uniformity of the susceptor.

Also, thickness T of the upper flange section 120 is preferably 1 mm or larger. Such thickness brings about a reinforcing effect on the strength of the upper flange section 120. Meanwhile, the thickness T is preferably 5 mm or smaller in view of the thermal uniformity of the susceptor.

Also, a horizontal distance D between the outer-periphery-side end 116e of each wafer pocket 116 and the outer peripheral wall 114e of the lower member body 114m is preferably 2 mm or larger in view of the thermal uniformity of the wafer pocket 116, i.e. the thermal uniformity of the wafer placed in the wafer pocket 116.

Meanwhile, the lower member 114 can be formed by coating a carbon (C) base member with an SiC film or the like. In this way, the susceptor 110 can be made even lighter in weight.

[Third Embodiment]

Figure 12:
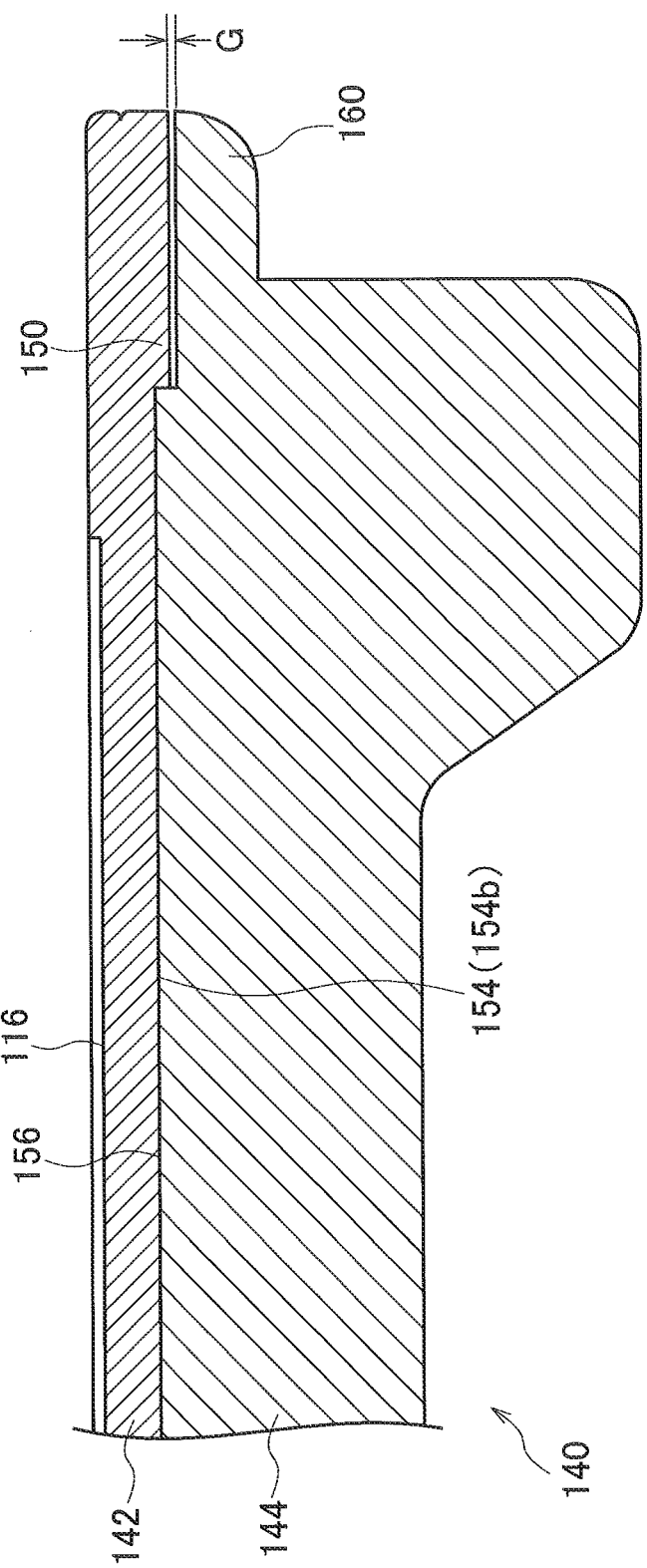
FIG. 12 is a side cross-sectional view showing main part of a susceptor according to a third embodiment.

Next, a third embodiment will be described. FIG. 12 is a side cross-sectional view Showing main part of a susceptor according to this embodiment.

Unlike the second embodiment, a susceptor 140 in this embodiment includes a convex fitting section and a concave fitting section formed upside down. Specifically, the susceptor 140 in this embodiment includes an upper member 142 and a lower member 144. Unlike the second embodiment, the upper member 142 includes an upper outer peripheral section 150 in place of the upper flange section 120. The dimensions of a lower outer peripheral section 160 which constitutes the lower member 144 are determined such that a predetermined gap G is formed between itself and the upper outer peripheral section 150.

With this structure, the upper member 142 includes a concave fitting section. 154 on its lower surface side, the concave fitting section 154 being recessed upward from a position radially inward of the upper outer peripheral section 150. The lower member 144 includes a convex fitting section 156 on its upper surface side and is configured to support the upper member 142 therewith, the convex fitting section 156 being configured to come into surface contact with a bottom surface (upper surface) 154b of the concave fitting section 154.

When the upper member 142 is set on the lower member 144 as the convex fitting section 156 is inserted into the concave fitting section 154, the lower member 144 is entirely covered by the upper member 142 in a plan view and the upper outer peripheral section 150 is not in contact with the lower outer peripheral section 160. Specifically, the gap G is formed between the upper outer peripheral section 150 and the lower outer peripheral section 160 when the upper member 142 is set on the lower member 144.

Also, in this embodiment, the positions where wafer pockets 116 are foil led are determined in advance such that the horizontal positions of the wafer pockets 116 are entirely situated radially inward of the upper outer peripheral section 150 when the upper member 142 is set on the lower member 144.

The upper member 142 is made of high-purity silicon carbide. The lower member 144 is made of silicon carbide with purity lower than the purity of the upper member 142. This embodiment brings about similar advantageous effects to those by the second embodiment.

[Fourth Embodiment]

Figure 13:
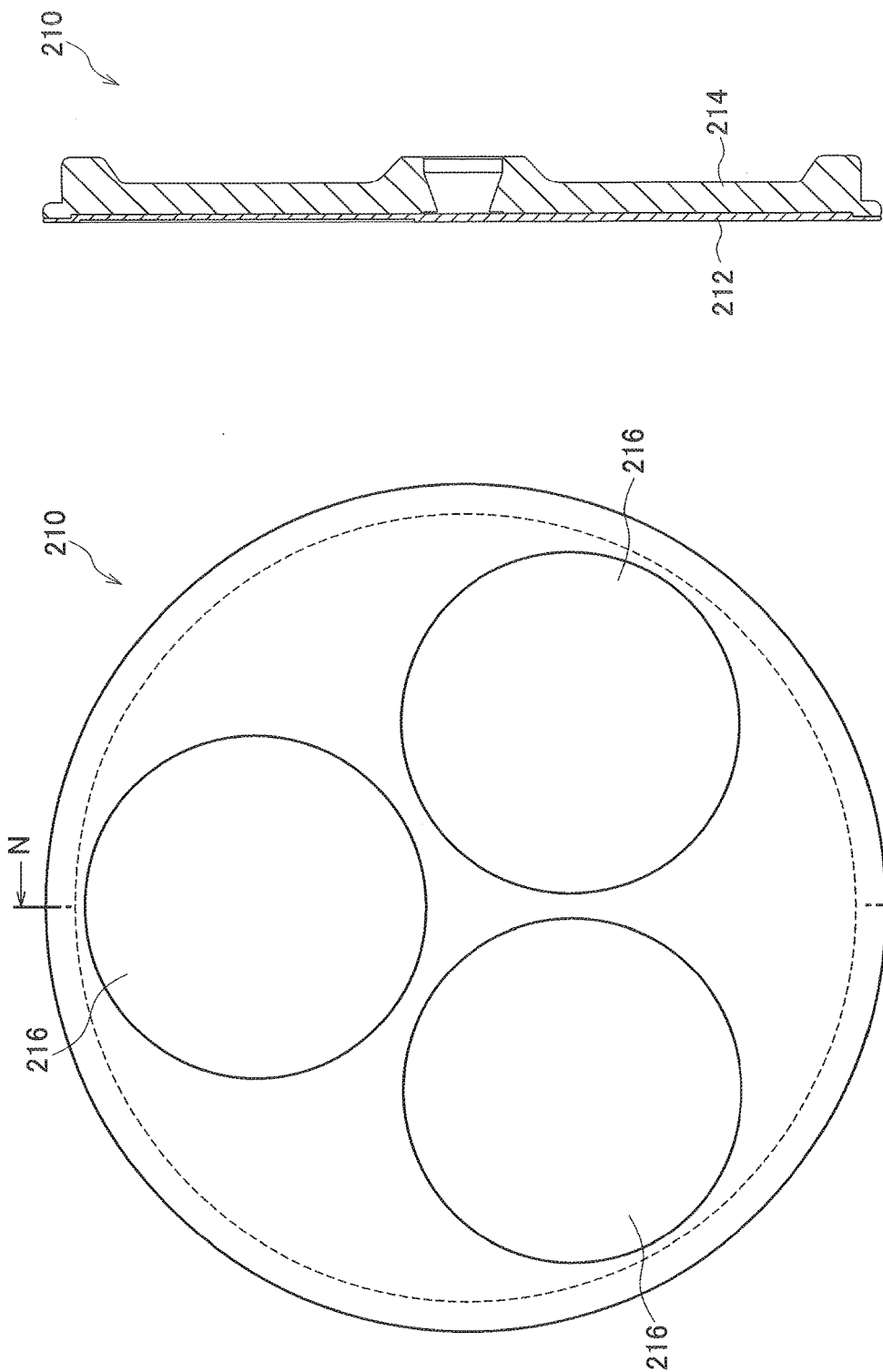
FIG. 13(a) is a plan view showing a susceptor according to a fourth embodiment.
FIG. 13(b) is a side cross-sectional view taken along a line N-N in FIG. 13(a).
Figure 14:
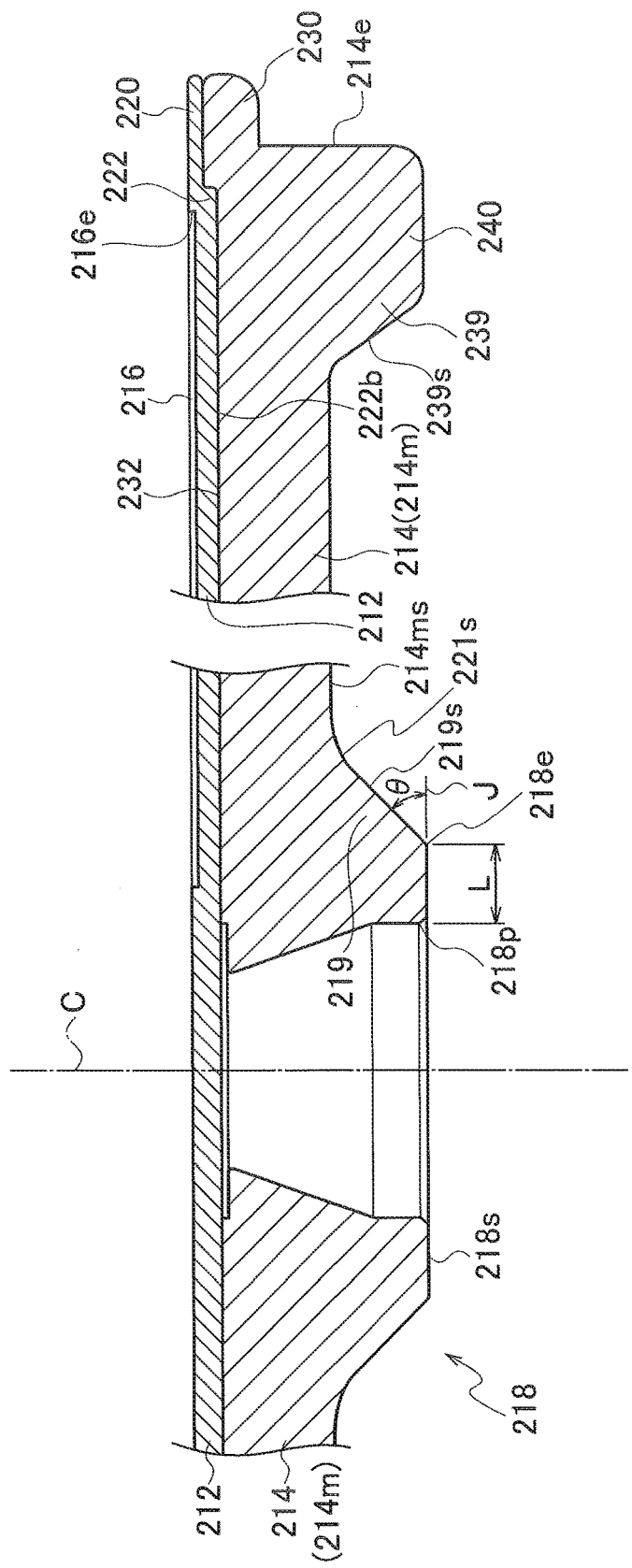
FIG. 14 is a partially enlarged view of FIG. 13(b).

Next, a fourth embodiment will be described. FIG. 13(a) is a plan view showing a susceptor according to this embodiment. FIG. 13(b) is a side cross-sectional view taken along a line N-N in FIG. 13(a). FIG. 14 is a partially enlarged view of FIG. 13(b).

As shown in FIG. 13(a), FIG. 13(b), and FIG. 14, a susceptor 210 in this embodiment includes an upper member 212 and a lower member 214. The upper member 212 and the lower member 214 each have a circular plate shape when seen from a projection plane parallel to a wafer placement surface (i.e. in a plan view). The upper member 212 and the lower member 214 are each made of silicon carbide.

The upper member 212 is a plate-shaped member made of silicon carbide and includes a wafer placement surface on which to place wafers on its upper surface side. Wafer pockets 216 in which to place wafers are formed on the upper surface side.

The lower member 214 is made of silicon carbide and supports the upper member 212 laid thereon. Also, the lower member 214 includes a bearing section 218 at the rotational center position thereof, the bearing section 218 being configured to receive a spindle shaft to be inserted from below. This bearing section 218 protrudes downward. Moreover, the lower member 214 includes a bearing lower surface 218s forming the lower surface side of the bearing section 218, and an expanding surface 219s expanding gently in an obliquely upward direction from an outer periphery 218e of the hearing lower surface 218s and continuing to a lower-member-body lower surface 214ms around the bearing section 218 (lower surface of a lower member body 214m). This expanding surface 219s is formed by a thick portion 219 continuing to the lower member body 214m and thereby burying a corner between the lower member body 214m and the bearing section 218.

Also, an angle θ between an imaginary extension plane J extending from the bearing lower surface 218s and the expanding surface 219s is in the range of 15 to 80°. Moreover, the expanding surface 219s includes a curved surface 221s connected to the lower-member-body lower surface 214ms and having a radius of curvature R in the range of 0.1 to 10 mm. Note that the bearing lower surface 218s is a flat surface in this embodiment.

Also, in this embodiment, an upper flange section 220 is formed as an outer peripheral section of the upper member 212. Further, the upper member 212 includes a convex fitting section 222 on its lower surface side, the convex fitting section 222 protruding downward from a position radially inward of the upper flange section 220. The lower member 214 includes a concave fitting section 232 on its upper surface side and is configured to support the upper member 212 therewith, the concave fitting section 232 being configured to come into surface contact with a lower surface 222b of the convex fitting section 222.

When the upper member 212 is set on the lower member 214 as the convex fitting section 222 is inserted into the concave fitting section 232, the lower member 214 is entirely covered by the upper member 212 in a plan view and the outer peripheral section of the upper member 212 (upper flange section 220) is not in contact with the lower member 214. Also, the lower member 214 includes a lower outer peripheral section 230 (lower flange section) formed to face the upper flange section 220 when the upper member 212 is set on the lower member 214.

Also, in this embodiment, the positions where the wafer pockets 216 are formed are determined in advance such that the horizontal positions of the wafer pockets 216 are entirely situated radially inward of the upper flange section 220 when the upper member 212 is set on the lower member 214.

Also, in this embodiment, the lower outer peripheral section 230 protrudes radially outward from the lower member body 214m, which constitutes the lower member 214. Further, the horizontal position of an outer-periphery-side end 216e of each wafer pocket 216 is situated radially inward of an outer peripheral wall 214e of the lower member body 214m.

Also, the upper member 212 is made of high-purity silicon carbide, e.g. silicon carbide having a purity of 6N or higher. Here, N represents purity. 3N means a purity of 99.9%, and 6N means a purity of 99.9999%. "Purity" means the purity of the main metallic material and is a value obtained by subtracting the amount of metallic impurities from 100 and expressed as "100%−metallic impurities (%)=purity (%)."

In a specific, detailed example, the upper member 212 is obtained by processing a mixture containing silicon carbide with a hot press in a temperature condition of 2000 to 2400° C. and a pressure condition of 300 to 700 kg/cm$^2$. With the purity of the silicon carbide in the upper member 212 being 6N or higher, reduction in temperature increase rate and heat utilization efficiency of the susceptor 210 can be suppressed.

The lower member 214 supports the upper member 212 and is laid on the upper member 212 in the direction perpendicular to the wafer placement surface. In other words, the lower member 214 is arranged on a heating source (heater) side relative to the upper member 212.

Also, the lower member 214 is made for example of silicon carbide having a purity of 99 to 99.9%. In a specific, detailed example, the lower member 214 is obtained by sintering a mixture containing silicon carbide with use of a sintering aid such as yttria ($Y_2O_3$) in a temperature condition of 2000 to 2200° C. In the case Where the lower member 214 is made of silicon carbide as above, the purity of the silicon carbide constituting the lower member 214 is lower than the purity of the silicon carbide constituting the upper member 212 and is preferably in the range of 2N to 3N. With the purity of the silicon carbide constituting the lower member 214 being 3N or lower, direct transfer of the heater's pattern to the wafers is suppressed. On the other hand, with the purity of the silicon carbide constituting the lower member 214 being 2N or higher, reduction in temperature increase rate and heat utilization efficiency of the susceptor 210 is suppressed.

In this embodiment, the thermal conductivity of the upper member 212 is higher than the thermal conductivity of the lower member 214. For example, the thermal conductivity of the upper member 212 is 200 W/(m·K)or higher, and the thermal conductivity of the lower member 214 is in the range of 140 to 170 W/(m·K), In this case, the thermal conductivity of the upper member 212 is 200 W/(m·K) or higher for a similar reason to the reason why the purity of the silicon carbide constituting the upper member 212 is 6N or higher. The thermal conductivity of the lower member 214 is in the range of 140 to 170 W/(m·K) for a similar reason to the reason why the purity of the silicon carbide constituting the lower member 214 is in the range of 2N to 3N.

Also, the thermal resistance of the upper member 212 is lower than the thermal resistance of the lower member 214. The thermal resistance of the upper member 212 is $5.0 \times 10^{-3}$ m·K/W or lower, and the thermal resistance of the lower member 214 is in the range of $5.8 \times 10^{-3}$ to $7.1 \times 10^{-3}$ m·K/W. With the thermal resistance of the upper member 212 being $5.0 \times 10^{-3}$ m·K/W or lower, reduction in temperature increase rate and heat utilization efficiency of the susceptor 210 can be suppressed. With the thermal resistance of the lower member 214 being $5.8 \times 10^{-3}$ m·K/W or higher, direct transfer of the heater's pattern to the wafers can be suppressed. On the other hand, with the thermal resistance of the lower member 214 being $7.1 \times 10^{-3}$ m·K/W or lower, reduction in temperature increase rate and heat utilization efficiency of the susceptor 210 can be suppressed.

(Advantageous Effects)

Advantageous effects of this embodiment will be described below.

In this embodiment, the upper member 212 and the lower member 214 are each made of silicon carbide. Moreover, the lower member 214 is such that the angle θ between the imaginary extension plane J, which extends from the bearing lower surface 218s, and the expanding surface 219s is in the range of 15 to 80°, i.e. the angle (obtuse angle) between the bearing lower surface 218s and the expanding surface 219s is in the range of 100 to 165°. In addition, the expanding surface 219s includes the curved surface 221s, which is connected to the lower-member-body lower surface 214ms and has a radius of curvature R in the range of 0.1 to 10 mm.

Thus, the structure is such that the thick portion 219, which includes the expanding surface 219s, extends continuously around the bearing section 218. In this way, it is possible to suppress deterioration in thermal uniformity in the bearing section 218 and a portion therearound and also reinforce the strength, as compared to a case where the thick portion 219 is not provided or a case where a thick portion is provided which forms a large step between the lower member body 214m and the bearing section 218 through cutting of a portion irrelevant to the heat withdrawal. Hence, a susceptor 210 with a structure that prevents breakage can be obtained even if the susceptor 210 is made of silicon carbide and made lighter in weight.

If the angle θ is smaller than 15°, the weight of the lower member body 214m is too heavy. If the angle θ is larger than 80°, the thermal uniformity is deteriorated, and the lower member 214 is likely to break due to stress concentration. In view of these points, a preferable range of the angle θ is between 30° and 55° inclusive.

Also, if the radius of curvature R of the curved surface 221s is smaller than 0.1 mm, it is below the minimum radius of curvature which a grinding wheel can form, and drastically increases the time taken for the working. If the radius of curvature R of the curved surface 221s is larger than 10 mm, it is difficult to sufficiently reduce the weight of the lower member body 214m.

Also, in this embodiment, when the upper member 212 is set on the lower member 214 as the convex fitting section 222 is inserted into the concave fitting section 232, the lower member 214 is entirely covered by the upper member 212 in a plan view. In this way, the heat in the lower member 214 is prevented from escaping upward from the lower outer peripheral section 230 and causing a local temperature drop.

Also, the thermal conductivity of the plate-shaped upper member 212, which includes the wafer placement surface, is higher than the thermal conductivity of the lower member 214. In this way, reduction in temperature increase rate and heat utilization efficiency of the susceptor 210 is suppressed. On the other hand, the thermal conductivity of the lower member 214, which is arranged on the heater side relative to the upper member 212, is lower than the thermal conductivity of the upper member 212. In this way, direct transfer of the heater's pattern to the wafers is suppressed and thus the thermal uniformity in the wafer placement surface is improved.

Also, the arranging of the lower member 214 on the heater side relative to the upper member 212 makes it difficult for the heat in the susceptor 210 to escape therefrom through a support supporting the susceptor 210.

Length L from an opening-wall lower end portion 218$p$ of the bearing section 218 to the outer periphery 218$e$ is preferably 1 mm or larger. In this way, the thermal uniformity of the bearing section 218 can be sufficiently high, and the strength of the bearing section 218 can be sufficiently high.

Figure 15:
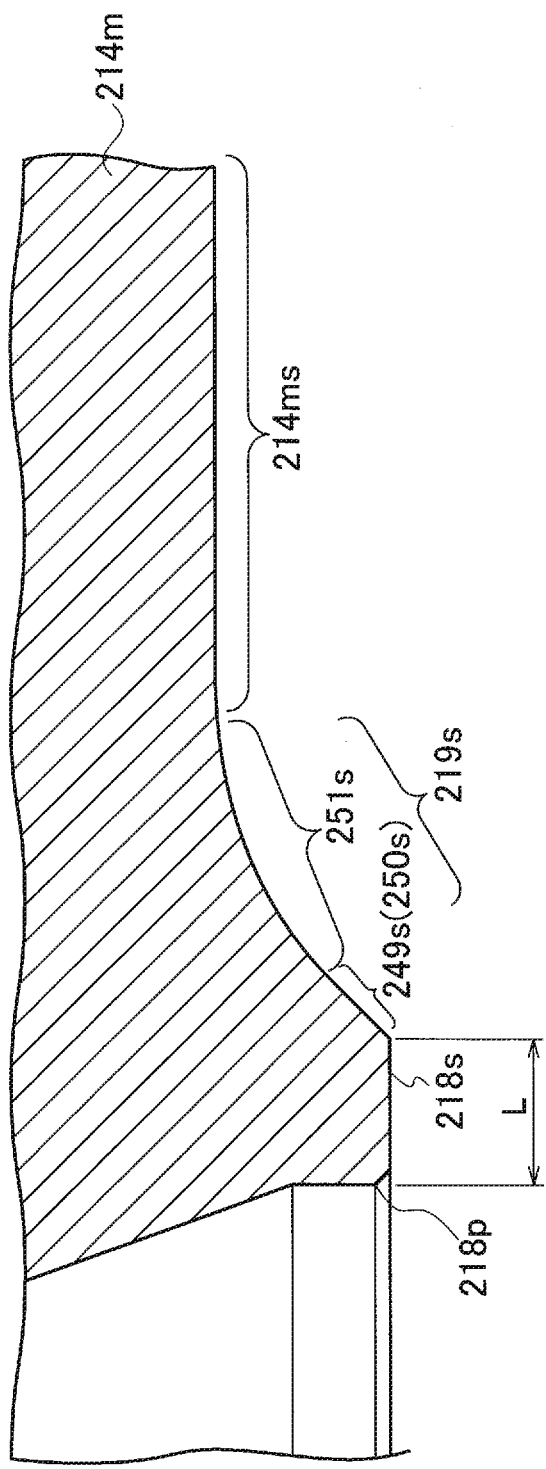
FIG. 15 is a partially enlarged cross-sectional view schematically showing a modification of the fourth embodiment.

Alternatively, a straight portion 249$s$ and a curve 251$s$ may be formed in place of the expanding surface 219$s$ and the curved surface 221$s$. In a cross section (see FIG. 15) taken along a plane including a center line C (see FIG. 14) of the bearing section 218, the straight portion 249$s$ continues to the bearing lower surface 218$s$, and the curve 251$s$ is connected to the straight portion 249$s$ and the lower-member-body lower surface 214$ms$ and has a radius of curvature R in the range of 0.1 to 10 mm. With this straight portion 249$s$, i.e., a circular conical surface 250$s$, being connected to the bearing lower surface 218$s$, the structure further alleviates stress concentration as compared to a case where the curve is connected to the bearing lower surface 218$s$ in the cross section mentioned above.

In sum, if the radius of curvature R of the curved surface 221$s$ is larger than 10 mm, the straight portion 249$s$ is so small that the two bent surfaces are connected to each other and a step is formed at their boundary. The step may possibly lead to breakage by stress concentration. In view of this point, the radius of curvature R is more preferably between 1 mm and 8 mm inclusive and even more preferably between 2 mm and 6 mm inclusive.

Also, in view of reducing the possibility of formation of a step at the boundary, the length of the straight portion 249$s$ is preferably 1 mm to 3 mm.

Meanwhile, the above description has been given based on the case where the expanding surface 219$s$ is formed around the bearing section 218. However, besides the bearing section 218, a step is formed also by a portion protruding downward from the lower member 214, e.g. a step formed as shown in FIG. 14 by an annular protruding portion 240 protruding downward around the outer periphery of the lower member 214. For this step, too, similar advantageous effects can be achieved by forming an expanding surface 239$s$ similar to the expanding surface 219$s$ by forming a thick portion 239 in such a way as to bury the step.

Also, in this embodiment, the gap formed between the upper flange section 220 and the lower outer peripheral section 230 when the upper member 212 is set on the lower member 214 is preferably 0.1 mm or smaller. In this way, it is easy to sufficiently prevent the upper member 212 from being detached from the lower member 214 and thrown out while the susceptor 210 is in use.

Also, the lower member 214 can be made of graphite. In this way, the susceptor 210 can be made further lighter in weight.

TEST EXAMPLE 1

The inventors of this application evaluated the robustness, the thermal uniformity, and the weight of susceptors with a diameter of 450 φ (i.e. susceptors with a diameter of 450 mm) by using Examples 1 to 7 as the susceptors in the above embodiments and Comparative Examples 1 and 2 as susceptors for comparison. FIG. 16 shows conditions for each susceptor and its evaluation results. In FIG. 16, the robustness and the thermal uniformity are evaluated such that "○" represents good robustness/thermal uniformity, "Δ" represents good or rather poor robustness/thermal uniformity, and "×" represents poor robustness/thermal uniformity; and the weight is evaluated such that "○" means a good weight, "INCREASED" means rather excessive weight increase or excessive weight increase, and "REDUCED" means rather excessive weight reduction or excessive weight reduction. Note that in FIG. 16, the numbers given in the column of angle θ are described in terms of degree measure and the unit is "°".

In this test example, the thermal uniformity was rather poor when the angle θ was 10° (Comparative Example 1), but the thermal uniformity was excellent when the angle θ was 15° (Example 2). Also, the robustness was poor when the angle θ was 85° (Comparative Example 2), but the robustness was good when the angle θ was 80° (Example 3).

TEST EXAMPLE 2

The inventors of this application also evaluated the robustness, the thermal uniformity, and the weight of susceptors with a diameter of 117 φ (i.e. susceptors with a diameter of 117 mm) by using Examples 8 to 14 as the susceptors in the above embodiments and Comparative Examples 3 and 4 as susceptors for comparison. FIG. 17 shows conditions for each susceptor and its evaluation results. In this test example, too, the evaluation results were similar to those in Test Example 1. Note that in FIG. 17, the column of angle θ is described in terms of degree measure and the unit is "°."

While some embodiments of the present invention have been described hereinabove, these embodiments are mere examples described and presented to facilitate the understanding of the present invention, and the present invention is not limited to such embodiments. The technical scope of the present invention is not limited to the specific technical matters disclosed in the above embodiments, but encompasses various modifications, changes, alternative techniques, and the like easily derivable therefrom.

This application claims priority to Japanese Patent Application No. 2013-177869 filed on Aug. 29, 2013, Japanese Patent Application No. 2014-171502 filed on Aug. 26, 2014, and Japanese Patent Application No. 2014-171504 filed on Aug. 26, 2014, the entire contents of which are incorporated herein by reference.

INDUSTRIAL APPLICABILITY

A susceptor according to the present invention is capable of achieving improved thermal uniformity while suppressing reduction in its temperature increase rate and heat utilization efficiency, and is also capable of achieving a longer life than conventional ones even if the susceptor is not entirely made of high-purity silicon carbide. Also, the susceptor according to the present invention is capable of preventing breakage thereof even if the susceptor is made of silicon carbide and made lighter in weight.

REFERENCE SIGNS LIST 10 first member
11 concave section
20 second member
100, 110, 140, 210 susceptor
112, 142, 212 upper member
114, 144, 214 lower member
116 wafer pocket
122, 156 convex fitting section
122b lower surface
154b bottom surface
132, 154 concave fitting section
214m lower member body
214ms lower-member-body lower surface (lower surface of lower member body)
218 bearing section
218e outer periphery
218p opening-wall lower end portion
218s bearing lower surface
219s expanding surface
221s curved surface
249s straight portion
251s curve
E outer periphery
G gap
J imaginary extension plane
P inner peripheral end
T thickness
θ angle

The invention claimed is:

1. A susceptor comprising:
a plate-shaped first member including a top surface having a wafer placement surface on which to place a wafer, a second surface located opposite the wafer placement surface, and an outer edge surface connecting the top surface to the second surface, the second surface being a continuous surface contacting the outer edge surface; and
a second member supporting the entire length of the continuous surface of the first member and laid on the first member in a direction perpendicular to the wafer placement surface, wherein
thermal conductivity of the first member is higher than thermal conductivity of the second member, the first member is made of silicon carbide having a purity of 6N or higher, and the second member is made of silicon carbide having a purity of 2N to 3N, where N represents the number of a series of 9s indicating the proportion of the main metallic material in percentage by weight,
wherein the second member has a uniform thickness in a direction perpendicular to the wafer placement surface in a stacking surface of the first member and the second member, and a thickness of the susceptor in the direction perpendicular to the wafer placement surface is constant.

2. The susceptor according to claim 1, wherein the first member is configured to be detachably attachable to the second member.

3. The susceptor according to claim 1, wherein the thermal conductivity of the second member is in a range of 140 to 170 W/(m·K).

4. The susceptor according to claim 1, wherein thickness of the second member is in a range of 5 to 15 mm.

5. The susceptor according to claim 1, wherein thermal resistance of the second member is in a range of $5.8 \times 10^{-3}$ to $7.1 \times 10^{-3}$ m·K/W.

6. The susceptor according to claim 1, wherein the second member has any one of a plate shape and an annular shape.

7. The susceptor according to claim 1, wherein the outer edge surface extends 1 mm or more from the top surface to the second surface.

* * * * *